United States Patent
Fazeli Chaghooshi et al.

(10) Patent No.: US 11,489,546 B2
(45) Date of Patent: Nov. 1, 2022

(54) PRE-CODING AND DECODING POLAR CODES USING LOCAL FEEDBACK

(71) Applicant: The Regents of the University of California, Oakland, CA (US)

(72) Inventors: Arman Fazeli Chaghooshi, San Diego, CA (US); Kuangda Tian, Beijing (CN); Alexander Vardy, Escondido, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 17/397,987

(22) Filed: Aug. 10, 2021

(65) Prior Publication Data

US 2021/0367620 A1 Nov. 25, 2021

Related U.S. Application Data

(62) Division of application No. 16/703,634, filed on Dec. 4, 2019, now Pat. No. 11,121,728.

(Continued)

(51) Int. Cl.
*H03M 13/00* (2006.01)
*H03M 13/45* (2006.01)
*H03M 13/39* (2006.01)

(52) U.S. Cl.
CPC ..... *H03M 13/458* (2013.01); *H03M 13/3988* (2013.01)

(58) Field of Classification Search
None
See application file for complete search history.

(56) References Cited

U.S. PATENT DOCUMENTS 9,176,927 B2* 11/2015 Gross ............. H03M 13/157
10,291,359 B2* 5/2019 Xu ............. H04L 1/0061

(Continued)

OTHER PUBLICATIONS

Afisiadis, O. et al., "A Low-Complexity Improved Successive Cancellation Decoder for Polar Codes," Proc. of IEEE Asilomar Conf. on Signals, Systems and Computers, vol. 48, pp. 2116-2120, Nov. 2014.

(Continued)

*Primary Examiner* — Mujtaba M Chaudry
(74) *Attorney, Agent, or Firm* — Perkins Coie LLP

(57) ABSTRACT

Disclosed are devices, systems and methods for precoding and decoding polar codes using local feedback are described. One example method for improving an error correction capability of a decoder includes receiving a noisy codeword vector of length n, the codeword having been generated based on a concatenation of a convolutional encoding operation and a polar encoding operation and provided to a communication channel prior to reception by the decoder, performing a successive-cancellation decoding operation on the noisy codeword vector to generate a plurality of polar decoded symbols (n), generating a plurality of information symbols (k) by performing a convolutional decoding operation on the plurality of polar decoded symbols, wherein k/n is a rate of the concatenation of the convolutional encoding operation and the polar encoding operation, and performing a bidirectional communication between the successive-cancellation decoding operation and the convolutional decoding operation.

20 Claims, 10 Drawing Sheets

Related U.S. Application Data

(60) Provisional application No. 62/775,266, filed on Dec. 4, 2018.

(56) References Cited

U.S. PATENT DOCUMENTS

| | | | | |
|---|---|---|---|---|
| 2017/0353269 | A1* | 12/2017 | Lin | H04L 1/0045 |
| 2018/0198560 | A1* | 7/2018 | Jiang | H04L 1/0064 |
| 2018/0226999 | A1* | 8/2018 | Wang | H04L 1/0041 |
| 2018/0331699 | A1* | 11/2018 | Lin | H03M 13/13 |
| 2019/0190655 | A1* | 6/2019 | Pan | H04L 1/0088 |

OTHER PUBLICATIONS

Arikan, E. "Channel polarization: A method for constructing capacity-achieving codes for symmetric binary-input memoryless channels," IEEE Trans. on Inform. Theory, vol. 55, pp. 3051-3073, Jul. 2009.

Balatsoukas-Stimming, A. et al., "Comparison of Polar Decoders with Existing Low-Density Parity-Check and Turbo Decoders," arXiv preprint arXiv:1702.04707 (2017).

CharnKeitKong, P. et al., "On classes of rate k/(k+1) convolutional codes and their decoding techniques," IEEE Trans. on Inform. Theory, vol. 42, pp. 2181-2193, Nov. 1996.

Chiu, M. et al., "Reduced-complexity SCL Decoding of multi-CRC-aided polar codes," arXiv preprint arXiv:1609.08813 (2016).

Miloslavskaya, V. et al., "Sequential decoding of polar codes," IEEE Communications Letters, vol. 18, pp. 1127-1130, Jul. 2014.

Niu, K. et al., "Stack decoding of polar codes," Electronics letters, vol. 48, pp. 695-697, Jun. 2012.

Tal, I. et al., "How to construct polar codes," IEEE Trans. on Inform. Theory, vol. 59, pp. 6562-6582, Oct. 2013.

Tal, I. et al., "List decoding of polar codes," IEEE Trans. on Inform. Theory, vol. 61, pp. 2213-2226, May 2015.

Trifonov, "Efficient design and decoding of polar codes," IEEE Trans. on Communications, vol. 60, pp. 3221-3227, Nov. 2012.

Trifonov, T. et al., "Polar Subcodes," IEEE Journal on Selected Areas in Communications, vol. 34(2), pp. 254-266, 2016.

Trifonov, P. "Star polar subcodes," Proc. of IEEE Wireless Communicationsand Networking Conference, Mar. 2017.

Viterbi, A. "Error bounds for convolutional codes and an asymptotically optimum decoding algorithm," IEEE Trans. on Inform. Theory, vol. 13, pp. 260-269, Apr. 1967.

Wang, Y et al., "Interleaved concatenations of polar codes with BCH and convolutional codes." IEEE Journal on Selected Areas in Communications, vol. 34(2), pp. 267-277, 2016.

Wu, D., et al., "Construction and block error rate analysis of polar codes over AWGN channel based on Gaussian approximation," IEEE Communications Letters, vol. 18, pp. 1099-1102, Jul. 2014.

* cited by examiner

```
Algorithm 1: Summary of the SC decoding algorithm
Input: received vector y
Output: a decoded vector û
1  for i = 0, 1, ..., n − 1 do
2      calculate P(u_i = 0|y, u_0^{i−1}) and P(u_i = 1|y, u_0^{i−1})
3      if u_i is frozen then
4          set û_i to the frozen value of u_i
5      else
6          if P(u_i = 0|y, u_0^{i−1}) > P(u_i = 1|y, u_0^{i−1}) then
7              set û_i ← 0
8          else
9              set û_i ← 1
10 return the length-k information sub-vector of û
```

Algorithm 2: A high-level description of SC decoding equipped with $\gamma$-limited Arikan's genie

Input: received vector $y$
Output: a decoded vector $\hat{u}$ 1 set $g \leftarrow \gamma$
2 for $i = 0, 1, \ldots, n-1$ do
3     calculate $P(u_i = 0 | y, u_0^{i-1})$ and $P(u_i = 1 | y, u_0^{i-1})$
4     if $u_i$ *is frozen* then
5         set $\hat{u}_i$ to the frozen value of $u_i$
6     else
7         if $P(u_i = 0 | y, u_0^{i-1}) > P(u_i = 1 | y, u_0^{i-1})$ then
8             set $\hat{u}_i \leftarrow 0$
9         else
10            set $\hat{u}_i \leftarrow 1$
11         if $\hat{u}_i \neq u_i$ and $g > 0$ then
12             set $\hat{u}_i \leftarrow u_i$
13             set $g \leftarrow (g - 1)$ 14 return the length-$k$ information sub-vector of $\hat{u}$

FIG. 5

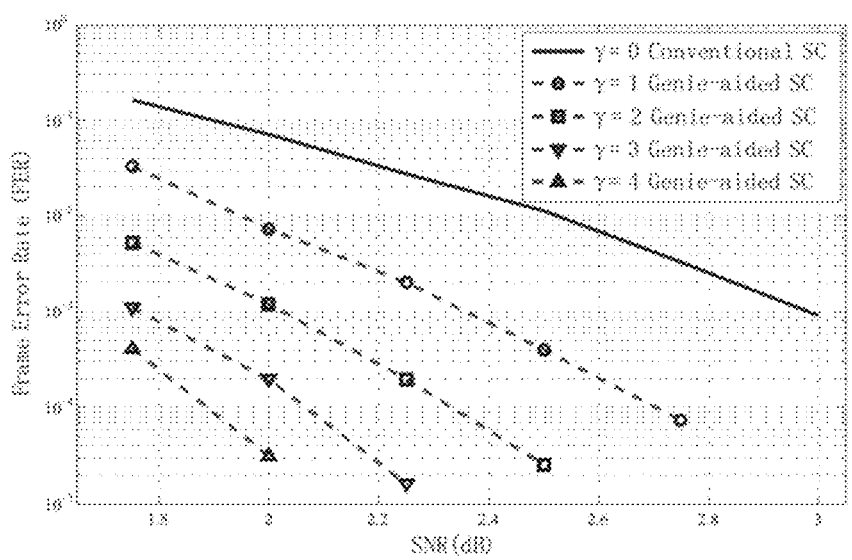

FIG. 6

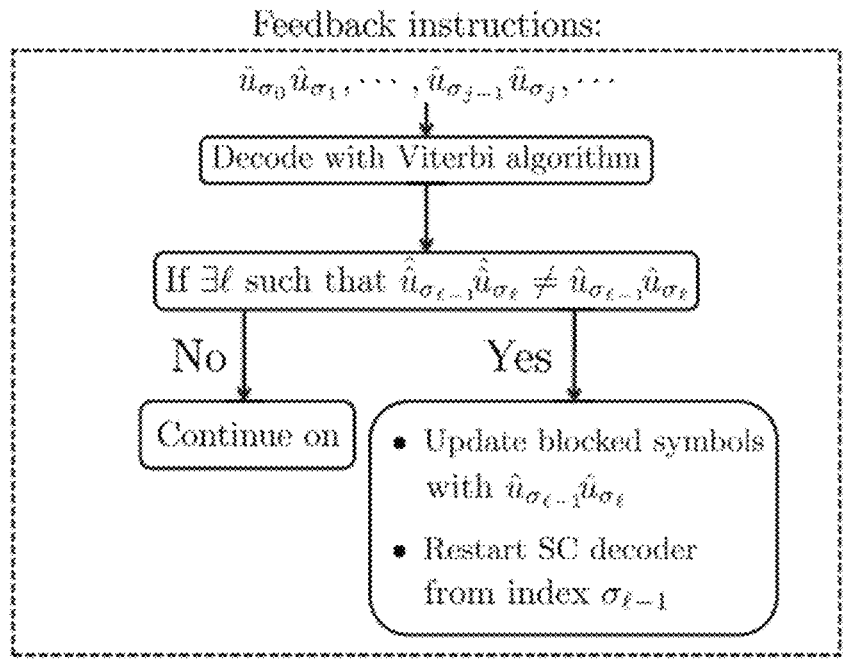

FIG. 9

SC decoder instruction (with blocked symbols):

| More noisy index | Blocked symbols $\hat{u}_{\sigma_{\ell-1}}\hat{u}_{\sigma_\ell}$ | | | SC instructions | |
|---|---|---|---|---|---|
| | 1 | 2 | 3 | $\hat{u}_{\sigma_{\ell-1}}$ | $\hat{u}_{\sigma_\ell}$ |
| $\sigma_{\ell-1}$ | $\alpha\beta$ | | | flip | derive |
| $\sigma_{\ell-1}$ | $\alpha\beta$ | $\sim\alpha\delta$ | | keep | flip |
| $\sigma_{\ell-1}$ | $\alpha\beta$ | $\sim\alpha\delta$ | $\alpha\sim\beta$ | flip | flip |
| $\sigma_\ell$ | $\alpha\beta$ | | | keep | flip |
| $\sigma_\ell$ | $\alpha\beta$ | $\alpha\sim\beta$ | | flip | derive |
| $\sigma_\ell$ | $\alpha\beta$ | $\alpha\sim\beta$ | $\sim\alpha\delta$ | flip | flip |

FIG. 10

PRE-CODING AND DECODING POLAR CODES USING LOCAL FEEDBACK

CROSS-REFERENCE TO RELATED APPLICATION

This patent application is a divisional of U.S. patent application Ser. No. 16/703,634 entitled "PRE-CODING AND DECODING POLAR CODES USING LOCAL FEEDBACK" and filed on Dec. 4, 2019 which claims priority to and benefits of U.S. Provisional Patent Application No. 62/775,266 entitled "PRE-CODING AND DECODING POLAR CODES USING LOCAL FEEDBACK" and filed on 4 Dec. 2018. The entire contents of the above patent applications are incorporated by reference in their entireties as part of the disclosure of this patent document.

TECHNICAL FIELD

This document generally relates to error correction codes, and more particularly to pre-coding and decoding polar codes using local feedback.

BACKGROUND

A communications system generally adopts channel encoding to improve reliability of data transmission and ensure quality of communications in the presence of various types of noise and errors. Polar coding is a general and extremely powerful error-correction technology proposed around a decade ago, and which is currently used for coding the control channels in the eMBB mode of the Fifth Generation (5G) wireless standard. In addition to wireless communications, polar codes may have applications in fiber-optic networks, data storage, satellite communications, and more.

SUMMARY

Embodiments of the disclosed technology relate to methods, devices and systems for improving an error correction capability of an encoder and decoder based on pre-coding and decoding polar codes using local feedback. The methods and devices described in the present document advantageously, among other features and benefits, reduce a communication receiver's complexity while realizing the potential of the performance of polar codes.

In an example aspect, a method for improving an error correction capability of a decoder includes receiving a noisy codeword vector of length n, the codeword having been generated based on a concatenation of a convolutional encoding operation and a polar encoding operation and provided to a communication channel or a storage channel prior to reception by the decoder, wherein n is a positive integer, performing a successive-cancellation decoding operation on the noisy codeword vector to generate a plurality of polar decoded symbols that comprises a plurality of convolutionally encoded symbols ($n_1$), a first plurality of information symbols ($k-n_1$), and a plurality of frozen symbols (n−k), wherein k and $n_1$ are non-negative integers, generating a second plurality of information symbols ($k_1$) by performing a convolutional decoding operation on the plurality of convolutionally encoded symbols, wherein $k_1$ is a non-negative integer, wherein $k_1/n_1$ is a rate of the convolutional encoding operation, and wherein $(k_1+k-n_1)/n$ is a rate of the concatenation of the convolutional encoding operation and the polar encoding operation, and performing a bidirectional communication between the convolutional decoding operation and the successive-cancellation decoding operation, wherein the bidirectional communication comprises decoding information.

In another example aspect, a method for improving an error correction capability of an encoder includes receiving a plurality of information symbols (k), wherein k is a positive integer, generating a plurality of convolutionally encoded symbols (n) by performing a convolutional encoding operation on the plurality of information symbols and a plurality of frozen symbols (n−k), wherein n is a positive integer, generating a plurality of polar encoded symbols by performing a polar encoding operation on the plurality of convolutionally encoded symbols, wherein the polar encoding operation is based on a transform, and wherein a rate of the polar encoding operation is one, and providing the plurality of polar encoded symbols for transmission or storage.

In yet another example aspect, a method for improving an error correction capability of an encoder includes receiving a noisy codeword vector of length n, the codeword having been generated based on a concatenation of a convolutional encoding operation and a polar encoding operation and provided to a communication channel or a storage channel prior to reception by the decoder, wherein n is a positive integer, performing a successive-cancellation decoding operation on the noisy codeword vector to generate a plurality of polar decoded symbols (n), generating a plurality of information symbols (k) by performing a convolutional decoding operation on the plurality of polar decoded symbols, wherein k is a positive integer, and wherein k/n is a rate of the concatenation of the convolutional encoding operation and the polar encoding operation, and performing a bidirectional communication between the successive-cancellation decoding operation and the convolutional decoding operation.

In yet another example aspect, the above-described methods may be implemented by an apparatus or device that comprises a processor and/or memory.

In yet another example aspect, these methods may be embodied in the form of processor-executable instructions and stored on a computer-readable program medium.

The subject matter described in this patent document can be implemented in specific ways that provide one or more of the following features.

BRIEF DESCRIPTION OF THE DRAWINGS

FIG. 5 illustrates a high-level description of another SC decoding algorithm.

FIG. 6 illustrates the FER of polar codes with a genie-aided SC decoding algorithm.

FIG. 9 illustrates an example of feedback instructions for resetting the SC decoder.

FIG. 10 illustrates an example of instructions for the SC decoder.

DETAILED DESCRIPTION

Figure 1:
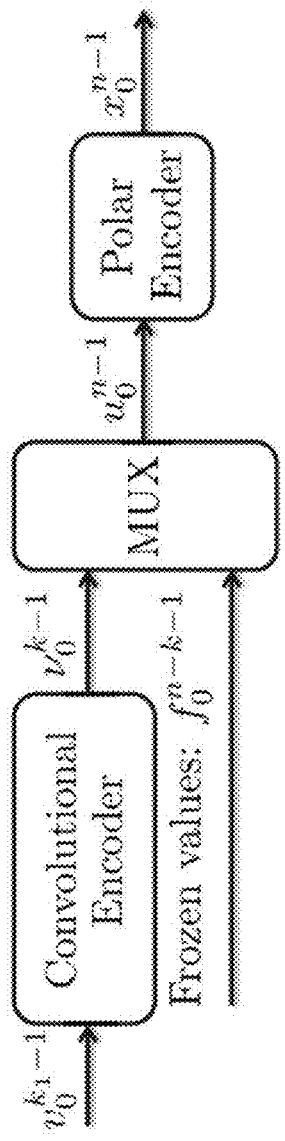
FIG. 1 is a block diagram illustrating an example embodiment of an encoder structure for a polar code.

Polar codes are a new approach to maximizing the rate and reliability of data transmissions, and have been adopted to improve coding performance for control channels in 5G. At the same time, they reduce the complexity of design and ensure service quality. Polar codes are a type of linear block error correcting code, whose code construction is based on a multiple recursive concatenation of a short kernel code which transforms the physical channel into virtual outer channels. When the number of recursive concatenations becomes large, the virtual channels tend to either have very high reliability or very low reliability (in other words, they polarize), and the data bits are allocated to the most reliable channels.

Embodiments of the disclosed technology relate to pre-coding and decoding polar codes using local feedback, thereby reducing a communication receiver's complexity while realizing the potential of the performance of polar codes. The disclosed embodiments can, for example, be used in any communication or data-storage system that is affected by noise and uses polar coding to correct errors. The disclosed embodiments may be particularly attractive in systems that already use polar coding, but can ill-afford higher complexity decoding algorithms such as CRC-aided list decoding. From a different viewpoint, the present document includes methods for improving performance of successive-cancellation decoding without significantly increasing the overall computational complexity/requirements. The value of polar codes is inherently boosted for many scenarios based on this improved and additional functionality.

Section headings are used in the present document to improve readability of the description and do not in any way limit the discussion or embodiments (and/or implementations) to the respective sections only.

Introduction to Polar Codes and Successive Cancellation Decoding

Polar codes. In the present document, embodiments of the disclosed technology use a (n, k) polar encoder, where $n=2^m$ corresponds to m levels of polarization and k denotes the number of information bits in the polar code, resulting in n−k frozen bits. In some embodiments, the frozen bits are set to zero. In other embodiments, the frozen bits are computed such that they are known a priori at both the transmitter and the receiver. The relationship between the transmitted symbols $\{x_i\}$ and the uncoded information bits $\{u_i\}$ is given by:

$$x = uG_n, \quad G_n = B_n \begin{bmatrix} 1 & 0 \\ 1 & 1 \end{bmatrix}^{\otimes m}.$$

Herein, $x=uG_n$ is referred to as a polar transformation, and $G_n$ is the polar code generator (or generating) matrix. In some embodiments, the polar code generator matrix is the m-th Kronecker power of the 2×2 kernel matrix that is multiplied by a length-n bit reversal matrix $B_n$ and u denotes the uncoded information bit vector that includes k information bits and n−k frozen bits. In an example, the 2×2 kernel matrix (denoted F) and the m-th Kronecker power of the kernel matrix for m=3 are given by:

$$F = \begin{bmatrix} 1 & 0 \\ 1 & 1 \end{bmatrix}, \text{ and}$$

$$F^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

In some embodiments, different 2×2 kernel matrices $$\left(\text{e.g., } \begin{bmatrix} 1 & 1 \\ 1 & 0 \end{bmatrix}\right)$$

may be used to generate the polar code. In other embodiments, the bit reversal matrix $B_n$ may be omitted in the generation of the polar code.

Successive cancellation (SC) decoding. SC decoding provably enables polar codes to achieve the capacity of memory symmetric channels. In an example, successive cancellation decoding starts by using the symbols received over the channel to decode a first bit, and then subsequent bits are decoded based on the symbols received over the channel and one or more previously decoded bits. For example, a tenth bit is decoded as a function of the symbols received over the channel and the values determined (e.g., "0" or "1") for at least one of the nine previous bits that have already been decoded.

In some embodiments, successive cancellation decoding comprises decoding $u_i$ for i=1, 2, . . . , n sequentially while assuming the values of the previous $u_i$'s. In other words, to decode $u_i$, it is assumed that the previous bits $u_{i-1}$, are all known (or correctly decoded) and hence available to the decoder similar to the channel observation vector y.

That is, given the channel observation vector y, the successive cancellation decoder estimates $\hat{u}_0, \hat{u}_1, \ldots, \hat{u}_{n-1}$ one-by-one by first efficiently calculating the following pair of probabilities at each step:

$$P(\hat{u}_i=0|y,u_0^{i-1}) \text{ and } P(\hat{u}_i=1|y,u_0^{i-1}).$$

Then, a decision is made on $\hat{u}_i \in \{0,1\}$.

In some embodiments, successive cancellation decoding can leverage the butterfly structure of polar codes to efficiently calculate the probability pair shown above for i=0, 1, . . . , n−1. Upon calculation of the probability pairs, the decision on $\hat{u}_i$ is prioritized by first looking up the available frozen values, and then the freshly calculated probabilities.

Examples of Encoder Structures for Embodiments of the Disclosed Technology

Embodiments of the disclosed technology provide concatenations of polar codes and convolutional codes, which advantageously enable the Viterbi algorithm to be used in the successive cancellation decoding of polar codes.

In some embodiments, let n denote the length of the uncoded vector u, which consists of n−k frozen indices (denoted $\mathcal{F}$) and k indices (denoted $\mathcal{I}$) that are typically used for information bits (or symbols). The embodiments described herein use a convolutional code to precode $k_1$ information bits into $n_1$=k coded ones. These k bits are placed in the indices in the set $\mathcal{I}$, and sent to a polar encoder along with the remaining information bits. This advantageously results in a concatenation between an $[n_1, k_1]$ convolutional code and a $[n, k=n_1]$ polar code.

FIG. 1 is a block diagram illustrating an example embodiment of an encoder structure for a polar code. As illustrated therein, a terminated convolutional code of length $n_1$ is generated from a sequence of $k_1$ information bits. The uncoded vector u (with regard to the polar code) is generated by multiplexing these k=$n_1$ bits with the n−k frozen bits. The multiplexed length-n vector u is then polar coded to form the length-n polar codeword x. The rate of the concatenated polar code illustrated in FIG. 1 is $k_1$/n.

In some embodiments, the frozen bits may be fixed to all zeros or all ones. In other embodiments, the frozen bits may be set to a predetermined patterns of zeros and ones. In yet other embodiments, the frozen bits may be dynamically determined based on values of other bits that are multiplexed before that specific frozen bit.

In an example, the convolution code in FIG. 1 may be a rate-1/2 convolutional code, in which case the rate of the concatenated polar code illustrated in FIG. 1 is $k_1$/n~k/2n.

In an example, the convolutional code may have a generator matrix given by $$G_{conv}=[1+D^2, 1+D+D^2].$$

Convolutional codes provide a natural local error correction capability, which can be utilized as a genie-like aid provided for successive cancellation decoder. The traceback depth in convolutional codes determines the required delay to validate a bit from the received sequence by Viterbi Algorithm. It is known that the successive cancellation of polar codes suffers from the error propagation phenomena, i.e., when it makes the first mistake during the decoding process, it is bound to make a large number of additional mistakes on the average. This property translates to a poor bit error rate (BER) for polar codes in general. Hence, it is desired to utilize a convolutional code with low traceback depth in order to increase the chance of correcting an error before future incorrect bits appear.

The traceback depth is estimated to have a linear relation with the constraint length of convolutional codes. However, precoding with convolutional codes with large constraint lengths has its own merits:

The free distance, denoted by $d_{free}$, measures the error correction capability of convolutional codes; and, the common constructions of convolutional codes with large $d_{free}$ usually require a large constraint length.

A large rate loss cannot be tolerated only to add a second layer protection for the information bits, since a simple reduced-rate polar code may show a better performance in fair comparisons. On the other hand, common constructions of convolutional codes with high rates also require larger constraint lengths.

Figure 2:
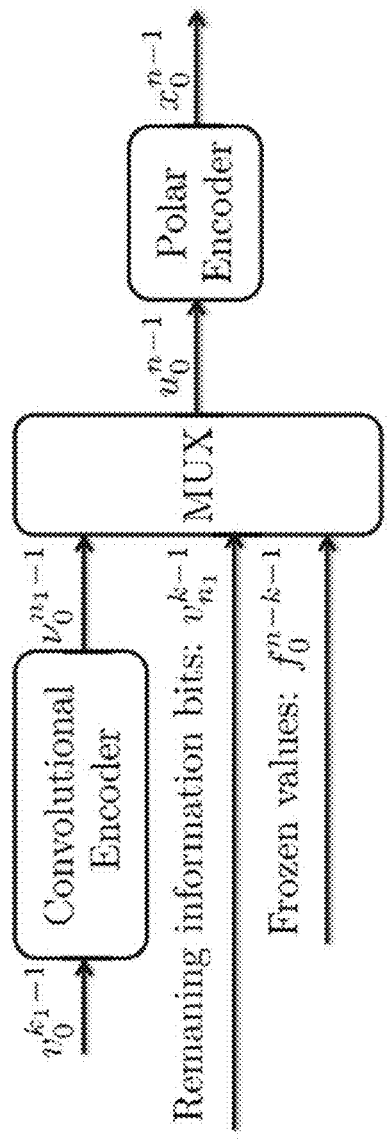
FIG. 2 is a block diagram illustrating another example embodiment of an encoder structure for a polar code.

In some embodiments, not all of the k bits in $\mathcal{I}$ require the extra protection of the convolutional code. In fact, most of the indices in $\mathcal{I}$ correspond to almost-noiseless bit channels. Accordingly, one can modify the encoder structure in FIG. 1 to protect only a small portion of the information bits with convolutional codes. This modification advantageously enables the use of convolutional codes with low traceback depths and simulates the polar genie more efficiently. FIG. 2 illustrated the improved encoder structure.

Figures 3, 4:
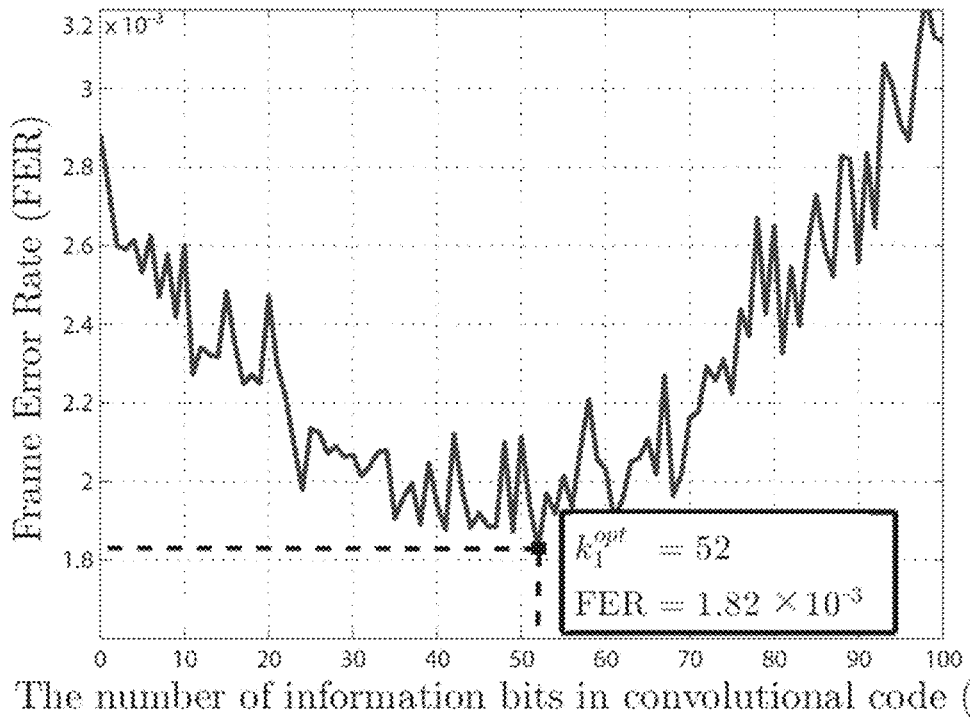
FIG. 3 illustrates the frame error rate (FER) of a polar code concatenated with a number of convolutional codes with different lengths.
FIG. 4 illustrates a high-level description of an SC decoding algorithm.

Embodiments of the disclosed technology include selecting an optimal value for $n_1$ to provide a second layer of error protection for the noisiest bits. In some embodiments, the optimal value can be numerically determined. FIG. 3 illustrates the frame error rate (FER) of an [8192, 4096] polar code concatenated with a number of convolutional codes with different lengths. In FIG. 3, $k_1$ denotes the length of the information bit sequence fed to the convolutional code, and the optimal codelength in this example is given by $n_1^{opt}$=108.

In some embodiments, the selection of the number of the frozen values (nominally n−k) and their multiplexing (as illustrated in the encoder structures in FIGS. 1 and 2) is similar to rate selection. That is, the rate of the concatenation of the convolutional code and the polar code can be adjusted by varying the number of frozen values selected and multiplexed into the input of the polar code.

In some embodiments, the location of the frozen bits (or symbols) can be selected based on the noise level of the corresponding bit-channel, which itself depends on the noise level of the communication channel. In an example, the n−k noisiest bit-channels are frozen, leaving the k less noisy ones for the information bits. Multiple algorithms may be used to track these noise levels very efficiently even for large values of n. Some algorithms that can be used include constructions based on Gaussian approximation and channel degradation.

In some embodiments, as discussed above, the polar encoding may be implemented using a generator matrix or a recursive butterfly structure. In an example, the polar encoding may use only a portion of rows of the generator matrix (G). In some embodiments, the rows of G that are used in the polar encoding process are selected based on their corresponding Bhattacharya parameters or Hamming weight of the rows of the matrix.

Examples of Decoding Structures for Embodiments of the Disclosed Technology

As described above, successive cancellation decoding is commonly used to decode polar codes, and a high-level description of the SC decoding algorithm is illustrated in FIG. 4. As illustrated therein, the input is a received vector y and the output is the decoded vector û. The algorithm includes first computing the probabilities $P(\hat{u}_i=0|y, \hat{u}_0^{i-1})$ and $P(\hat{u}_i=1|y, u_0^{i-1})$ for each bit (or symbol) of the received vector. As discussed above, if $u_i$ is frozen, then $\hat{u}_i$ is set to the value of frozen bit (since it is known at both the encoder and the decoder). Otherwise, the value of $\hat{u}_i$ is based on comparing the values of the probabilities.

The embodiments of successive-cancellation decoding described herein are designed to correct the received bits/symbols in a sequential fashion. Due to lack of feedback, traditional successive-cancellation decoding suffers significantly from error-propagation. In particular, at the receiver, there is no mechanism to correct an erroneous decision on a decoded bit/symbol once it happens. This single erroneous decision then adversely affects many future decisions in the successive-cancellation decoder. As described herein, embodiments incorporate an internal feedback mechanism into a polar decoding algorithm.

Additional details regarding successive cancellation decoding of polar codes may be found in U.S. Pat. No. 9,176,927, which is hereby incorporated by reference, in its entirety, as part of this application.

In some embodiments, polar codes may be decoded using a list decoding algorithm, which provides a list of L highly likely candidates for û. Existing implementations of list decoding show that selecting the most likely candidate from the list brings the error rate down to near optimal value (ML) even when small values of L are taken. However, by slightly modifying the structures polar codes by precoding the k information bits with a cyclic redundancy check (CRC), unverified candidates from the list can be first rejected and then the ML selection made. Hence, the CRC acts like a genie that informs the decoder about invalid codewords.

As discussed above, the decoding performance of polar codes is improved by leveraging the frozen values (in a genie-like manner) and may be further improved by using the genie (or a CRC-aided implementation) to help with the decoding of the non-frozen bits by correcting the wrongly decoded ones for a limited number of times.

However, the CRC-aided list decoding of polar codes (e.g., as described in U.S. Pat. No. 9,503,126) is characterized by the complexity of decoding growing proportionally to the list size. Thus, CRC-aided list decoding may be impractical if the required list size is too large and/or if the computational resources of the system are severely limited. In contrast, the complexity of decoding in the disclosed embodiments remains almost unchanged as compared to conventional successive-cancellation decoding. In fact, this complexity depends only on the number of decision errors expected in the worst case.

Examples of Genie-Aided SC Decoding of Polar Codes

In some embodiments, the genie-aided SC decoding of polar codes assumes that the SC decoder is equipped with some side information that helps correcting its first mistake (if there is any) during the decoding process. The probability of successful decoding is then given by $$P_{success} = \underbrace{\prod_{i \in J}(1 - p_i)}_{\text{no genie needed}} + \underbrace{\sum_{i \in J} p_i \prod_{j \in J, j \neq i}(1 - p_j)}_{\text{1-genie needed}}.$$

The FER in this case (e.g., correcting up to 1 mistake) is then expressed as $$P_e^{(1)} = 1 - \left(\prod_{i \in J}(1 - p_i)\right)\left(1 + \sum_{i \in J}\frac{p_i}{1 - p_i}\right).$$

Similarly, the genie may be used to correct γ errors. A high-level description of SC decoding algorithm that uses the genie up to γ times is illustrated in FIG. 5. The algorithm in FIG. 5 operates similarly to the algorithm illustrated in FIG. 4, but additionally includes setting the value of $\hat{u}_j$ for a non-frozen bit based on the correction capability of the genie.

FIG. 6 illustrates the FER of polar codes with a genie-aided SC decoding algorithm that is used to correct an increasing number of errors (plotted for γ=1, . . . , 4). As illustrated therein (for a [1024,512]-polar code), even for a very limited number of mistakes corrected, the performance of polar code decoding improves drastically.

Examples of Viterbi-Aided SC Decoding of Polar Codes

In some embodiments, the Viterbi-aided SC decoding of polar codes assumes that $J \cup \mathcal{F} = \{0, 1, \ldots n-1\}$ in which $J$ denotes the location of the unfrozen indices in u. It is further assumed that $J_{conv} = \{\sigma_0, \sigma_1, \ldots, \sigma_{n_1-1}\} \subset J$ corresponds to the indices in which the length-$n_1$ convolutional code is located, and that $\sigma_0 < \sigma_1 < \ldots < \sigma_{n_1-1}$. The Viterbi-aided SC decoder is an addition on top of the conventional SC decoder that reduces the overall error rate by decreasing rate of the decoding mistakes made on the bit-channels in $J_{conv}$.

In an example, and given the received vector y from the channel, the Viterbi-aided SC decoding of polar codes starts by estimating $\hat{u}_0, \hat{u}_1, \ldots$ one-by-one. After estimating $\hat{u}_i$, two different cases may appear:
- $i \in (J \cup \mathcal{F}) \setminus J_{conv}$: decoder continues the process normally as it would have done in the absence of the convolutional code.
- $i \in J_{conv}$ or equivalently $i = \sigma_j$ for some j: the freshly estimated value of $\hat{u}_{\sigma_j}$ is fed to the Viterbi decoder for second step validations.

If Viterbi decoder discovers any disparities on $\hat{u}_{\sigma_j}$, or those provided earlier from the SC decoder, i.e. $\hat{u}_{\sigma_l}, 1 \leq j$, a feedback arm gets activated. Upon activation of the feedback, the correct value of $\hat{u}_{\sigma_l}$, denoted by $\hat{\hat{u}}_{\sigma_l}$, is sent back to the SC decoding block. The SC decoder then resets its index back to $\sigma_l$, and restarts the calculations from there by considering the invalidated values for $\hat{u}_{\sigma_l}$ that are provided by the Viterbi decoder. In some embodiments, the Viterbi decoder is configured to keep and updated a list of invalidated symbols that it shares with the successive-cancellation decoder.

An overview of the Viterbi-aided SC decoding algorithm is provided in FIGS. 7-10.

Figure 7:
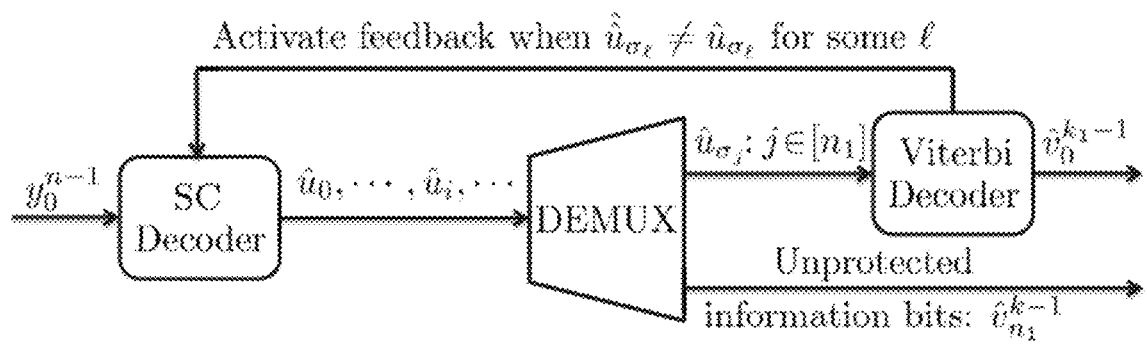
FIG. 7 is a block diagram illustrating an example of a Viterbi-aided successive cancellation (SC) decoder structure for a polar code.

As illustrated in FIG. 7, the output from SC decoder is split into two sequences: unprotected less-noisy bits, and $n_1$ bits that form the convolutional codeword for the second step verification. In some embodiments, the decoder structure in FIG. 7 is a joint convolutional and polar decoder, which combines convolutional decoding and polar decoding. As described herein, the convolutional decoder is configured to robustly identify errors that have occurred either in the previous block or in previous symbols of the current block. That is, convolutional decoding provides error detection, which is advantageously used to restart the SC decoder in order to improve overall decoding performance.

In some embodiments, the feedback mechanism only gets activated if the secondary error-detection module catches an inconsistency in the output of the SC decoder. When the signal-to-noise ratio is high, the SC decoder often makes no decision errors at all. Hence, the average decoding complexity remains unchanged. In addition, an appropriate choice of the secondary error-detection module (e.g., decoding over a convolutional trellis or tree that is associated with the convolutional encoder on the transmitter side, the Viterbi algorithm, the forward-backward algorithm (FBA), or the BCJR algorithm) makes it possible to perform the verification step very efficiently.

Figure 8:
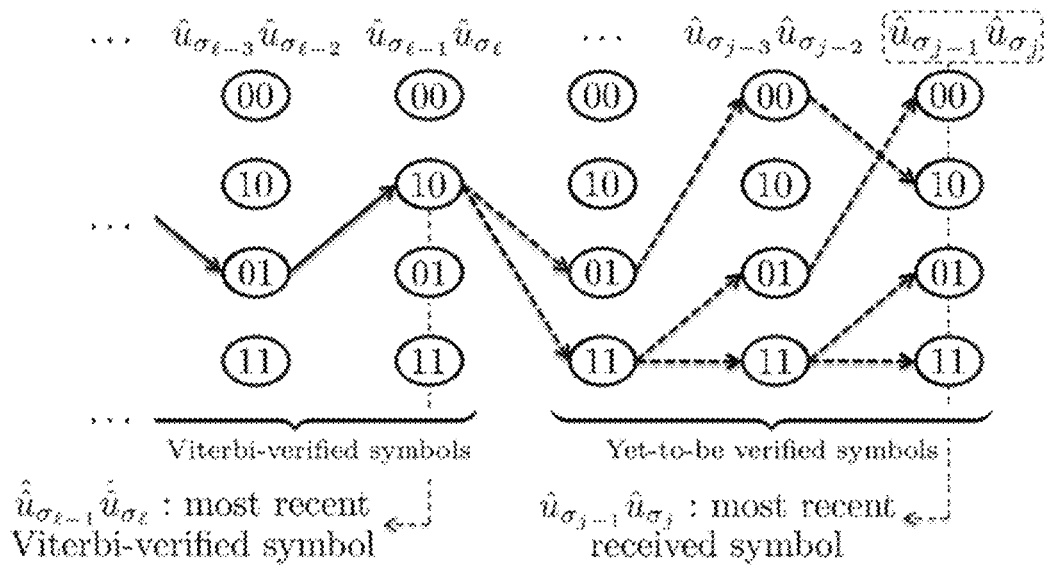
FIG. 8 illustrates an example snapshot of the Viterbi algorithm.

FIG. 8 illustrates an example snapshot of the Viterbi algorithm, wherein the sample trellis depicts the delay in symbol verification. A symbol is verified when all of the trellis paths agree on it. The feedback is activated when a symbol is verified to be incorrectly estimated by successive cancellation.

The example illustrated in FIG. 8 assumes that the input symbol for the Viterbi algorithm is formed of 2 bits. The input and output sequences of the Viterbi decoder are denoted as $\hat{u}_{\sigma_0}$, $\hat{u}_{\sigma_1}$, $\hat{u}_{\sigma_2}$, $\hat{u}_{\sigma_3}$, . . . and $\hat{\hat{u}}_{\sigma_0}$, $\hat{\hat{u}}_{\sigma_1}$, $\hat{\hat{u}}_{\sigma_2}$, $u_{\sigma_3}$, . . . , respectively. As illustrated in FIG. 8, there is some delay between the last received input symbol and the most recent verified one, which is statistically bounded by traceback depth of the convolutional code.

When a mismatch between input and output symbols is discovered, i.e., $\hat{\hat{u}}_{\sigma_{l-1}}\hat{\hat{u}}_{\sigma_l} \neq \hat{u}_{\sigma_{l-1}}\hat{u}_{\sigma_l}$, the feedback mechanism adds the incorrect symbol to the list of blocked symbols for indices $\{\sigma_{l-1}, \sigma_l\}$, and the SC decoding process is restarted from index $\sigma_{l-1}$ (as illustrated in FIG. 9).

In some embodiments, the immediate replacement of $\hat{u}_{\sigma_{l-1}}\hat{u}_{\sigma_l}$ with $\hat{\hat{u}}_{\sigma_{l-1}}\hat{\hat{u}}_{\sigma_l}$ is not allowed when a mismatch occurs since the latter is a function of the input sequence and has to be re-calculated according to the new input symbols. Instead, the SC decoder restarts the decoding process at by selecting the next most likely unblocked symbol. To determine the next most likely symbol, we value of the less reliable bit-channel is first flipped. If that comes back unverified as well, the algorithm proceeds by flipping the value of the more reliable bit-channel; and, if they both return unverified, the SC decoder flips both of them. The various operating cases are enumerated in FIG. 10.

In an example, it is assumed that the SC decoder is reset to index and is provided with an ordered set of blocked symbols $\{\alpha\beta, \sim\alpha\delta\}$ from the Viterbi decoder, where $\sim\alpha$ denotes the flipped value of $\alpha$. Further assume that $\sigma_{l-1}$ corresponds to the less reliable bit-channel between the two. It is observed that both values of $\alpha$, $\sim\alpha$ got rejected from the Viterbi decoder. Hence, the chances are that the decoding mistake was made on the more reliable bit-channel in the first place. SC decoder then proceeds by keeping $\hat{u}_{\sigma_{l-1}} = \alpha$ and flipping the decision on the next bit, i.e. $\hat{u}_{\sigma_l} = \sim\beta$.

In some embodiments, the Viterbi algorithm also accepts soft information (symbol likelihoods) as input. In other embodiments, the SC decoder is also capable of calculating the likelihoods for the bits in its output sequence. In yet other embodiments, the current decoding scheme can be improved by feeding the calculated soft information from the SC decoder to the Viterbi decoder instead of the hard decisions.

Example Simulation Results

Figure 11:
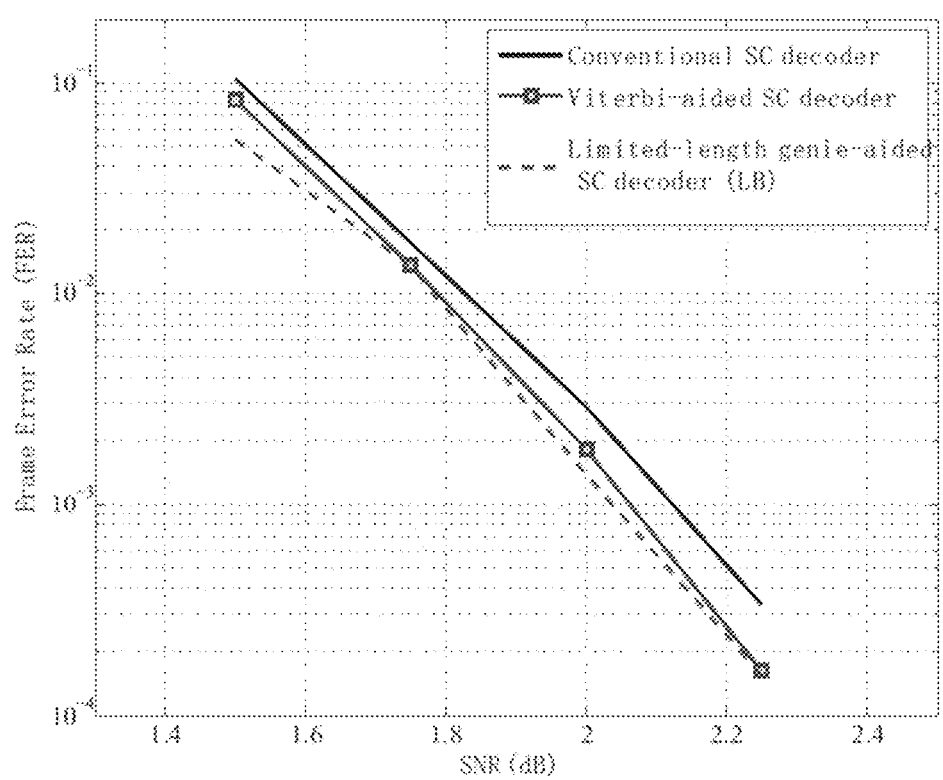
FIG. 11 illustrates the FER of polar codes with different SC decoding algorithms.

FIG. 11 illustrates the comparison between the Viterbi-aided SC decoding algorithm and a conventional [8192, 4096]-polar code under SC decoding. A noticeable improvement is observed particularity at high SNR regime. The lower bound (LB) curve corresponds to a genie-aided SC decoder, which is enabled on all those bit-channels that belong to the convolutional codeword. In other words, it prevents SC decoder from making any decoding mistakes on those $n_1$ bit-channels in $\mathcal{I}_{conv}$.

Decoding Complexity Analysis

The decoding complexity of the Viterbi algorithm is an asymptotic linear function of $n_1$. Furthermore, the Viterbi decoding block never activates the feedback if the message is correctly estimated by successive cancellation itself. The performance of the SC decoder in FIG. 11 indicates that this event, for instance, happens with very high probability [Pr.>0.99] at an SNR of 2 dB. Furthermore, a single iteration fixes the error in most of the cases, in which successive cancellation made a mistake.

Some embodiments of the disclosed technology can be implemented as configurations of an error correction decoder that allow the output of a conventional polar successive-cancellation decoder to be fed into a secondary error-correction decoding module on the fly. This secondary module provides feedback to the successive-cancellation decoder during the decoding process indicating which decisions on individual bits/symbols may be in error.

Feedback mechanism of the example embodiments described in the present document can be applied to combine successive-cancellation decoding of polar codes with a secondary error-detection module that allows decoding the received bits/symbols locally on the fly. The secondary error-detection module can be implemented using any one of a plurality of error-detection techniques or algorithms, such as a Viterbi decoding algorithm that is used for decoding convolutional codes.

Embodiments of the disclosed technology can be applied in any communication or data-storage system that is affected by noise and uses polar coding to correct errors. The disclosed embodiments may be particularly attractive in systems that already use polar coding, but can ill-afford higher complexity decoding algorithms such as CRC-aided list decoding.

Figure 12:
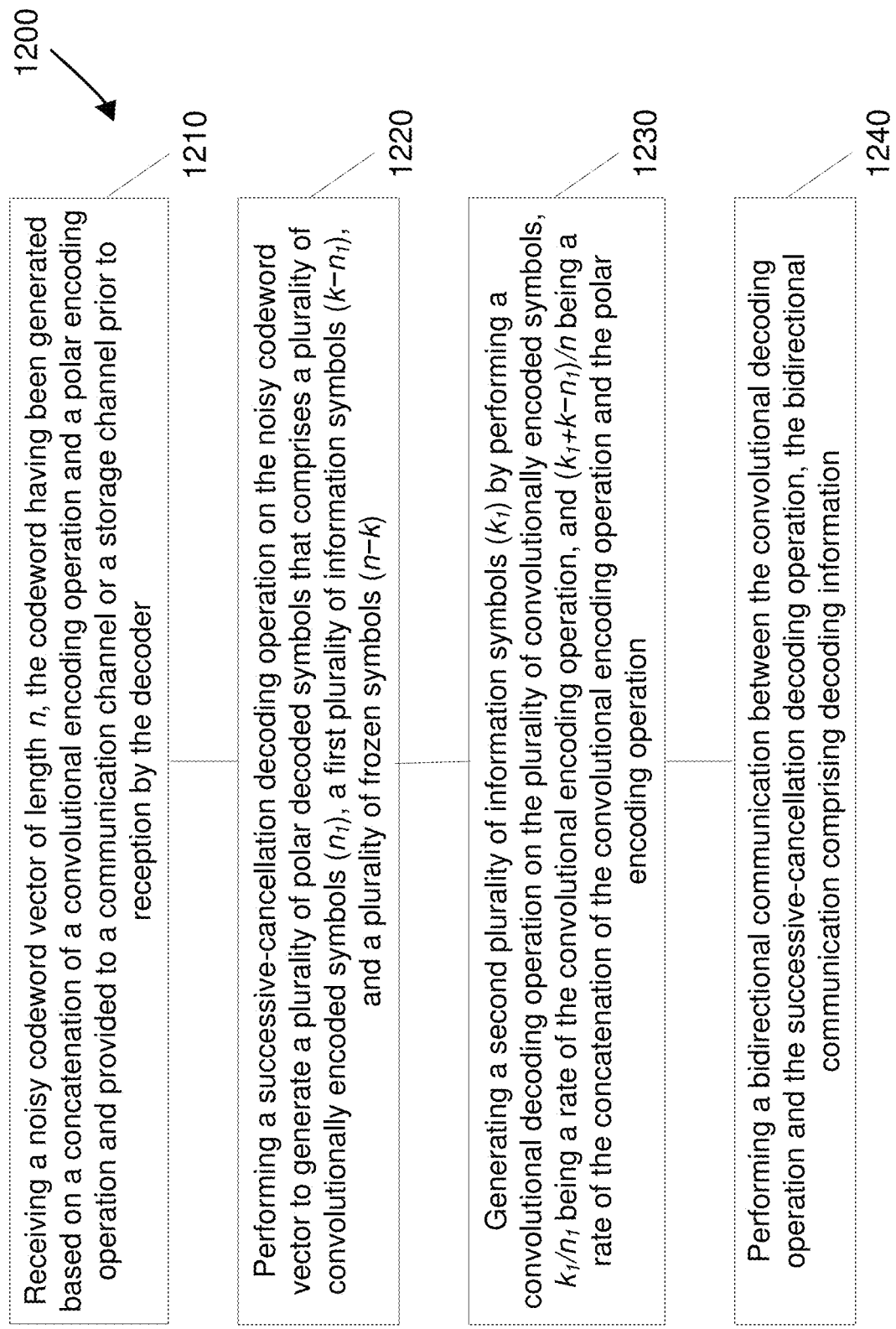
FIG. 12 illustrates a flowchart of an example method for encoding polar codes.

FIG. 12 illustrates a flowchart of an example method 1200 for polar encoding. The method 1200 includes, at operation 1210, receiving a noisy codeword vector of length n, the codeword having been generated based on a concatenation of a convolutional encoding operation and a polar encoding operation and provided to a communication channel or a storage channel prior to reception by the decoder, wherein n is a positive integer.

The method 1200 includes, at operation 1220, performing a successive-cancellation decoding operation on the noisy codeword vector to generate a plurality of polar decoded symbols that comprises a plurality of convolutionally encoded symbols ($n_1$), a first plurality of information symbols ($k-n_1$), and a plurality of frozen symbols (n-k), wherein k and $n_1$ are non-negative integers.

The method 1200 includes, at operation 1230, generating a second plurality of information symbols ($k_1$) by performing a convolutional decoding operation on the plurality of convolutionally encoded symbols, wherein $k_1$ is a non-negative integer, wherein $k_1/n_1$ is a rate of the convolutional encoding operation, and wherein $(k_1+k-n_1)/n$ is a rate of the concatenation of the convolutional encoding operation and the polar encoding operation.

The method 1200 includes, at operation 1240, performing a bidirectional communication between the convolutional decoding operation and the successive-cancellation decoding operation, wherein the bidirectional communication comprises decoding information.

In some embodiments, performing the convolutional decoding operation is based on decoding over a convolutional trellis or tree associated with the convolutional encoding operation, a Viterbi algorithm, a forward-backward algorithm (FBA) or a BCJR algorithm.

In some embodiments, an operation of the Viterbi algorithm is based on soft information or symbol likelihoods associated with the noisy codeword vector.

In some embodiments, the successive-cancellation decoding operation comprises a list decoding operation.

In some embodiments, the noisy codeword vector comprises symbols that correspond to the first plurality of information symbols, the second plurality of information symbols and a plurality of frozen symbols.

In some embodiments, at least one of the plurality of frozen symbols has a predetermined value or is based on one or more information symbols in the noisy codeword vector with indexes less than an index of the at least one of the plurality of frozen symbols.

In some embodiments, the one or more metrics comprise a location of at least one of the second plurality of information symbols, and the method 1200 further includes the operation of restarting the successive-cancellation decoding operation at the location.

In some embodiments, $n_1$ is equal to k or k is equal to n.

In some embodiments, the concatenation of the convolutional encoding operation and the polar encoding operation comprises partitioning information bits into the first plurality of information symbols and the second plurality of information symbols, performing the convolutional encoding operation on the first plurality of information symbols to generate a plurality of encoded symbols, multiplexing the plurality of encoded symbols, the second plurality of information symbols and the plurality of frozen symbols to generate a plurality of multiplexed symbols, and performing the polar encoding operation on the plurality of multiplexed symbols to generate the codeword.

In some embodiments, the method 1200 further includes the operation of adjusting the rate k/n based on configuring a number of the plurality of frozen symbols or puncturing the plurality of encoded symbols prior to the multiplexing.

In some embodiments, the polar encoding operation is based on a recursive "butterfly" computational structure or a multiplication of the plurality of multiplexed symbols by a generator matrix.

In some embodiments, the generator matrix (G) is defined as $$G = B \begin{bmatrix} 1 & 0 \\ 1 & 1 \end{bmatrix}^{\otimes m},$$

wherein ẞ denotes a Kronecker product, B is an n×n bit-reversal permutation matrix, $n=2^m$ is a length of the polar code, and m and n are integers.

In some embodiments, rows of the generator matrix used in the polar encoding operation are selected based on a Bhattacharya parameter or a Hamming weight of the rows of the generator matrix.

In some embodiments, the decoding information comprises control information or one or more metrics.

In some embodiments, the one or more metrics comprise one or more metrics derived from the convolutional decoding operation or one or more metrics derived from the successive-cancellation decoding operation.

In some embodiments, the control information comprises one or more validated estimated coded symbols or one or more invalidated coded symbols.

In some embodiments, the polar encoding operation comprises a transform, and wherein positions of the plurality of frozen symbols are based on one or more characteristics of the transform.

Figure 13:
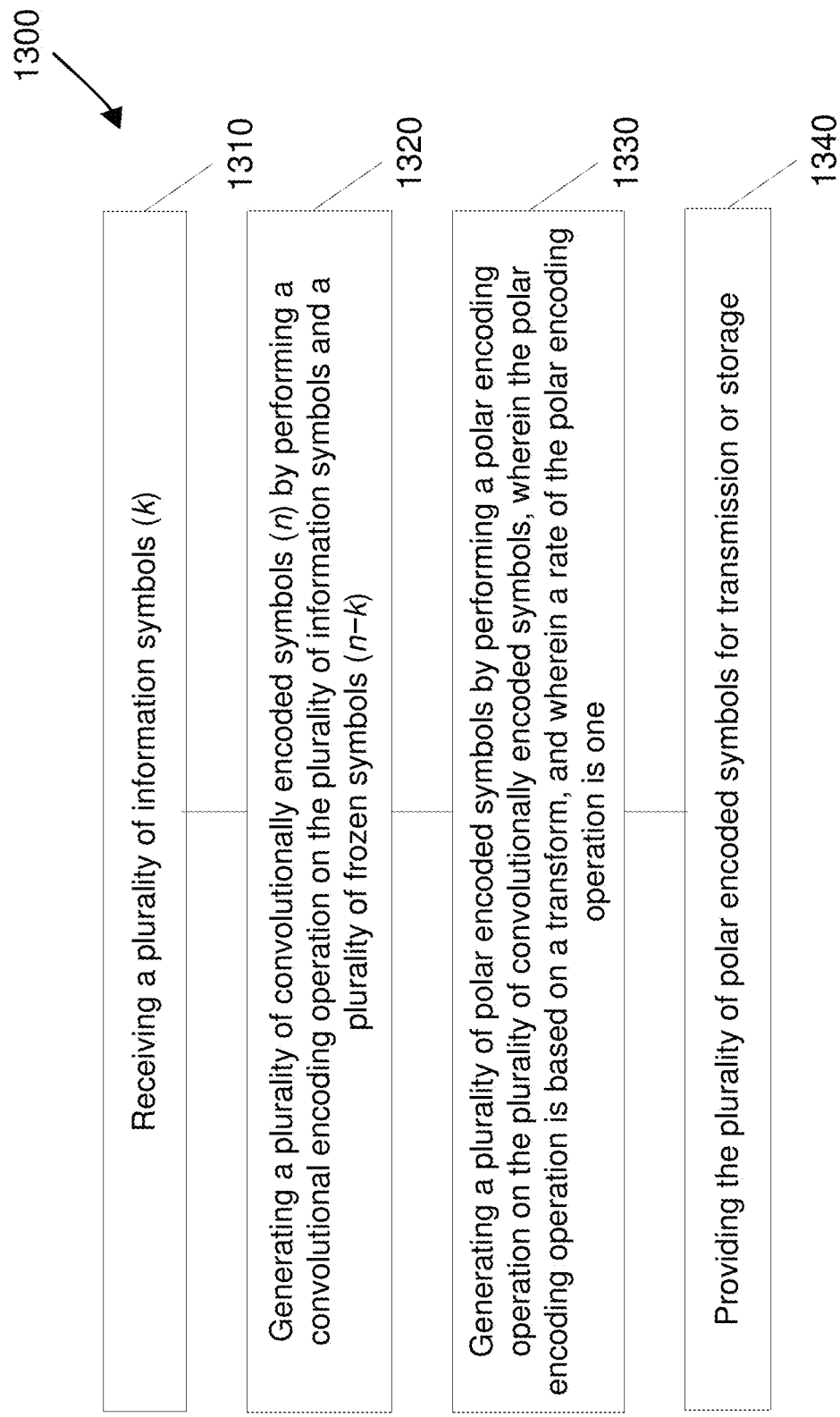
FIG. 13 illustrates a flowchart of an example method for decoding polar codes.

FIG. 13 illustrates a flowchart of an example method for decoding polar codes using local feedback. The method 1300 includes, at step 1310, receiving a plurality of information symbols (k), wherein k is a positive integer.

The method 1300 includes, at step 1320, generating a plurality of convolutionally encoded symbols (n) by performing a convolutional encoding operation on the plurality of information symbols and a plurality of frozen symbols (n−k), wherein n is a positive integer.

The method 1300 includes, at step 1330, generating a plurality of polar encoded symbols by performing a polar encoding operation on the plurality of convolutionally encoded symbols, wherein the polar encoding operation is based on a transform, and wherein a rate of the polar encoding operation is one.

The method 1300 includes, at step 1340, providing the plurality of polar encoded symbols for transmission or storage.

In some embodiments, the method 1300 further includes the operation of adjusting the rate k/n based on configuring a number of the plurality of frozen symbols or puncturing the plurality of encoded symbols prior to the multiplexing.

In some embodiments, the polar encoding operation is based on a recursive "butterfly" computational structure or a multiplication of the plurality of multiplexed symbols by a generator matrix.

In some embodiments, the generator matrix (G) is defined as $$G = B \begin{bmatrix} 1 & 0 \\ 1 & 1 \end{bmatrix}^{\otimes m},$$

wherein ẞ denotes a Kronecker product, B is an n×n bit-reversal permutation matrix, $n=2^m$ is a length of the polar code, and m and n are integers.

In some embodiments, rows of the generator matrix used in the polar encoding operation are selected based on a Bhattacharya parameter or a Hamming weight of the rows of the generator matrix.

In some embodiments, the decoding information comprises control information or one or more metrics.

In some embodiments, the one or more metrics comprise one or more metrics derived from the convolutional decoding operation or one or more metrics derived from the successive-cancellation decoding operation.

In some embodiments, the control information comprises one or more validated estimated coded symbols or one or more invalidated coded symbols.

In some embodiments, the polar encoding operation comprises a transform, and wherein positions of the plurality of frozen symbols are based on one or more characteristics of the transform.

Figure 14:
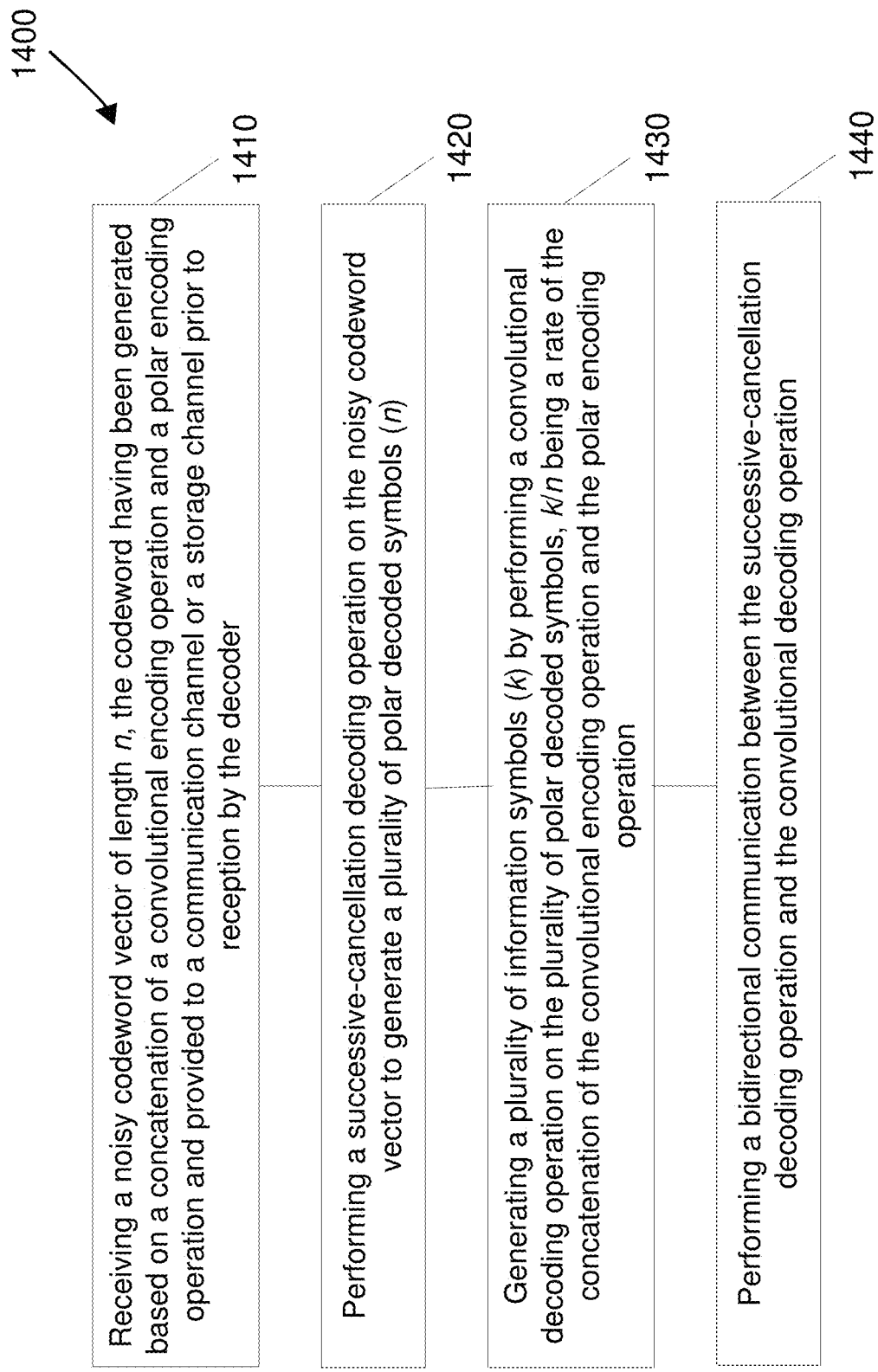
FIG. 14 illustrates a flowchart of another example method for decoding polar codes.

FIG. 14 illustrates a flowchart of another example method for decoding polar codes using local feedback. The method 1400 includes, at step 1410, receiving a noisy codeword vector of length n, the codeword having been generated based on a concatenation of a convolutional encoding operation and a polar encoding operation and provided to a communication channel or a storage channel prior to reception by the decoder, wherein n is a positive integer.

The method 1400 includes, at step 1420, performing a successive-cancellation decoding operation on the noisy codeword vector to generate a plurality of polar decoded symbols (n).

The method 1400 includes, at step 1430, generating a plurality of information symbols (k) by performing a convolutional decoding operation on the plurality of polar decoded symbols, wherein k is a positive integer, and wherein k/n is a rate of the concatenation of the convolutional encoding operation and the polar encoding operation.

The method 1400 includes, at step 1440, performing a bidirectional communication between the successive-cancellation decoding operation and the convolutional decoding operation.

In some embodiments, the performing the convolutional decoding operation is based on decoding over a convolutional trellis or tree associated with the convolutional encoding operation, a Viterbi algorithm, a forward-backward algorithm (FBA) or a BCJR algorithm.

In some embodiments, an operation of the Viterbi algorithm is based on soft information or symbol likelihoods associated with the noisy codeword vector.

In some embodiments, the bidirectional communication comprises control information or one or more metrics. In an example, the one or more metrics comprise one or more metrics derived from the convolutional decoding operation or one or more metrics derived from the successive-cancellation decoding operation. In another example, the control information comprises one or more validated estimated coded symbols or one or more invalidated coded symbols.

Figure 15:
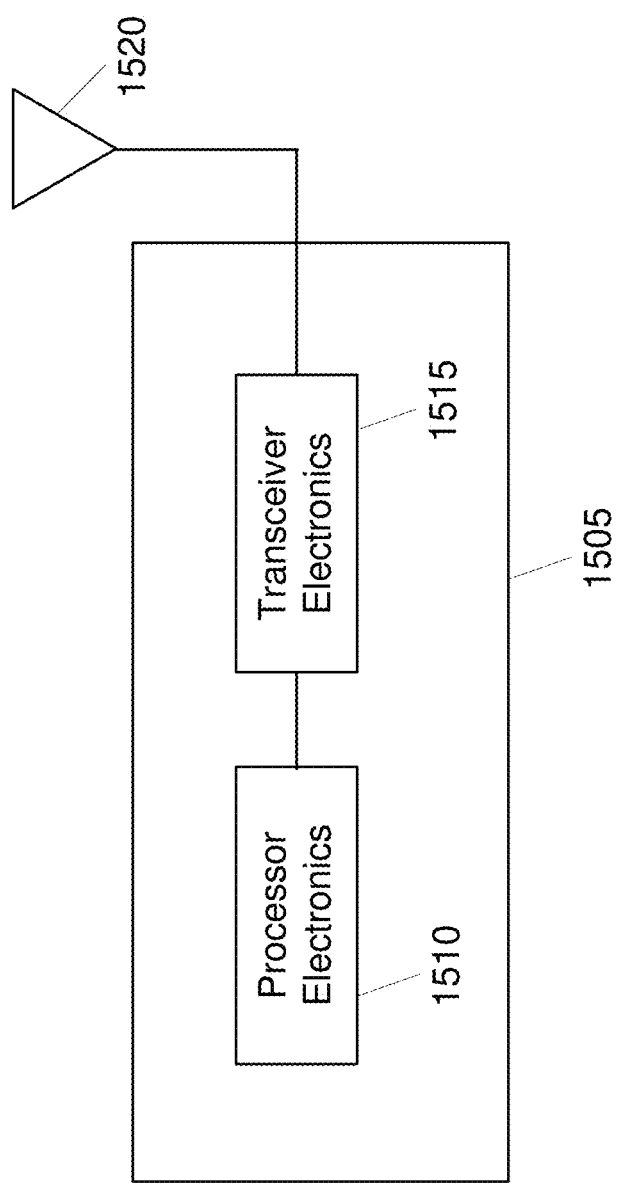
FIG. 15 is a block diagram representation of a portion of an apparatus, which can be used to implement some embodiments of the presently disclosed technology.

FIG. 15 is a block diagram representation of a portion of an apparatus, in accordance with some embodiments of the presently disclosed technology. An apparatus 1505, such as a base station or a wireless device (or UE), can include processor electronics 1510 such as a microprocessor that implements one or more of the techniques (including, but not limited to, methods 1200 and 1300) presented in this document. The apparatus 1505 can include transceiver electronics 1515 to send and/or receive wireless signals over one or more communication interfaces such as antenna(s) 1520. The apparatus 1505 can include other communication interfaces for transmitting and receiving data. Apparatus 1505 can include one or more memories (not explicitly shown) configured to store information such as data and/or instructions. In some implementations, the processor electronics 1510 can include at least a portion of the transceiver electronics 1515. In some embodiments, at least some of the disclosed techniques, modules or functions are implemented using the apparatus 1505. In some embodiments, the disclosed technology can be implemented as part of a computer system (e.g., a personal computer, a smartphone, a tablet or the like) to enable improved access to data stored on a memory device associated with the computer system. The disclosed embodiments provide enhanced error correction capabilities, which improve the reliability of data stored and accessed in the computer system; at the same time, these enhancements are achieved by reduced computational complexity of the operations compared to existing techniques.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A device for improving an error correction capability of an encoder, comprising:
    a processor; and
    a non-transitory memory including instructions stored thereon, wherein the instructions upon execution by the processor cause the processor to:
        receive a plurality of information symbols (k), wherein k is a positive integer;
        generate a plurality of convolutionally encoded symbols (n) by performing a convolutional encoding operation on the plurality of information symbols and a plurality of frozen symbols (n−k), wherein n is a positive integer;
        generate a plurality of polar encoded symbols by performing a polar encoding operation on the plurality of convolutionally encoded symbols, wherein the polar encoding operation is based on a transform, and wherein a rate of the polar encoding operation is one; and
        provide the plurality of polar encoded symbols for transmission or storage.

2. The device of claim 1, wherein the plurality of frozen symbols are set to a predetermined pattern of zeros and ones.

3. The device of claim 1, wherein a value of at least one of the plurality of frozen symbols is set based on a value of an output symbol of the convolutional encoding operation, and wherein the output symbol is output prior to the at least one of the plurality of frozen symbols being encoded by the convolutional encoding operation.

4. The device of claim 1, wherein the plurality of polar encoded symbols are provided to a communication channel for transmission or storage.

5. The device of claim 4, wherein a location of each of the plurality of frozen symbols is based on a noise level of the communication channel.

6. The device of claim 1, wherein the polar encoding operation is implemented using a generator matrix or a recursive butterfly structure.

7. The device of claim 6, wherein the polar encoding operation is implemented using a subset of rows of all rows of the generator matrix, and wherein the subset of rows is selected based on a Bhattacharya parameter or a Hamming weight for the corresponding row.

8. A method for improving an error correction capability of an encoder, comprising:
    receiving a plurality of information symbols (k), wherein k is a positive integer;
    generating a plurality of convolutionally encoded symbols (n) by performing a convolutional encoding operation on the plurality of information symbols and a plurality of frozen symbols (n−k), wherein n is a positive integer;
    generating a plurality of polar encoded symbols by performing a polar encoding operation on the plurality of convolutionally encoded symbols, wherein the polar encoding operation is based on a transform, and wherein a rate of the polar encoding operation is one; and
    providing the plurality of polar encoded symbols for transmission or storage.

9. The method of claim 8, wherein the plurality of frozen symbols are set to a predetermined pattern of zeros and ones.

10. The method of claim 8, wherein a value of at least one of the plurality of frozen symbols is set based on a value of an output symbol of the convolutional encoding operation, and wherein the output symbol is output prior to the at least one of the plurality of frozen symbols being encoded by the convolutional encoding operation.

11. The method of claim 8, wherein the plurality of polar encoded symbols are provided to a communication channel for transmission or storage.

12. The method of claim 11, wherein a location of each of the plurality of frozen symbols is based on a noise level of the communication channel.

13. The method of claim 8, wherein the polar encoding operation is implemented using a generator matrix or a recursive butterfly structure.

14. The method of claim 8, wherein the polar encoding operation is implemented using a subset of rows of all rows of the generator matrix, and wherein the subset of rows is selected based on a Bhattacharya parameter or a Hamming weight for the corresponding row.

15. A method for improving an error correction capability of a decoder, comprising:
    receiving a noisy codeword vector of length n, the codeword having been generated based on a concatenation of a convolutional encoding operation and a polar encoding operation and provided to a communication channel or a storage channel prior to reception by the decoder, wherein n is a positive integer, wherein a rate of the concatenation of the convolutional encoding operation and the polar encoding operation is based on a number of frozen symbols used in the polar encoding operation;
    generating a plurality of polar decoded symbols (n) by performing a successive-cancellation decoding operation on the noisy codeword vector;
    generating a plurality of information symbols (k) by performing a convolutional decoding operation on the plurality of polar decoded symbols, wherein k is a positive integer, wherein k/n is a rate of the concatenation of the convolutional encoding operation and the polar encoding operation; and
    performing a bidirectional communication between the successive-cancellation decoding operation and the convolutional decoding operation.

16. The method of claim 15, wherein the performing the convolutional decoding operation is based on decoding over a convolutional trellis or tree associated with the convolutional encoding operation, a Viterbi algorithm, a forward-backward algorithm (FBA), or a BCJR algorithm.

17. The method of claim 16, wherein an operation of the Viterbi algorithm is based on soft information or symbol likelihoods associated with the noisy codeword vector.

18. The method of claim 15, wherein the bidirectional communication comprises communicating control information or one or more metrics.

19. The method of claim 18, wherein the one or more metrics comprise one or more metrics derived from the convolutional decoding operation or one or more metrics derived from the successive-cancellation decoding operation.

20. The method of claim 18, wherein the control information comprises one or more validated estimated coded symbols or one or more invalidated coded symbols.

* * * * *